United States Patent [19]
Reams

[11] 4,325,394
[45] Apr. 20, 1982

[54] SUBMERSIBLE MOTOR CHEMICAL PROCESSING APPARATUS

[75] Inventor: Donald J. Reams, San Jose, Calif.

[73] Assignee: Micro Air Systems, Inc., Santa Clara, Calif.

[21] Appl. No.: 180,611

[22] Filed: Aug. 25, 1980

[51] Int. Cl.³ .............................................. B08B 3/04
[52] U.S. Cl. .................................. 134/141; 134/149; 418/232
[58] Field of Search ............... 134/141, 149, 153, 159; 418/232

[56] References Cited

U.S. PATENT DOCUMENTS

| 1,703,946 | 3/1929 | Melish ........................ 134/153 X |
| 1,914,016 | 6/1933 | Hobi ............................ 134/149 X |
| 3,760,822 | 9/1973 | Evans ........................... 134/149 X |
| 4,028,028 | 6/1977 | Fuchs, Jr. ..................... 418/232 X |

Primary Examiner—Robert L. Bleutge
Attorney, Agent, or Firm—Thomas E. Schatzel

[57] ABSTRACT

An apparatus for chemically processing an item by submersion in a liquid bath having a means for rotating the item while it is submerged. The means for rotating the item includes a positive displacement continuous-rotation motor capable of submersion in the liquid bath jointly with the item being processed. Operation of the continuous-rotation motor is energized by a flow of pressurized fluid which also serves to exclude the processing liquid chemical from the interior of the motor.

28 Claims, 8 Drawing Figures

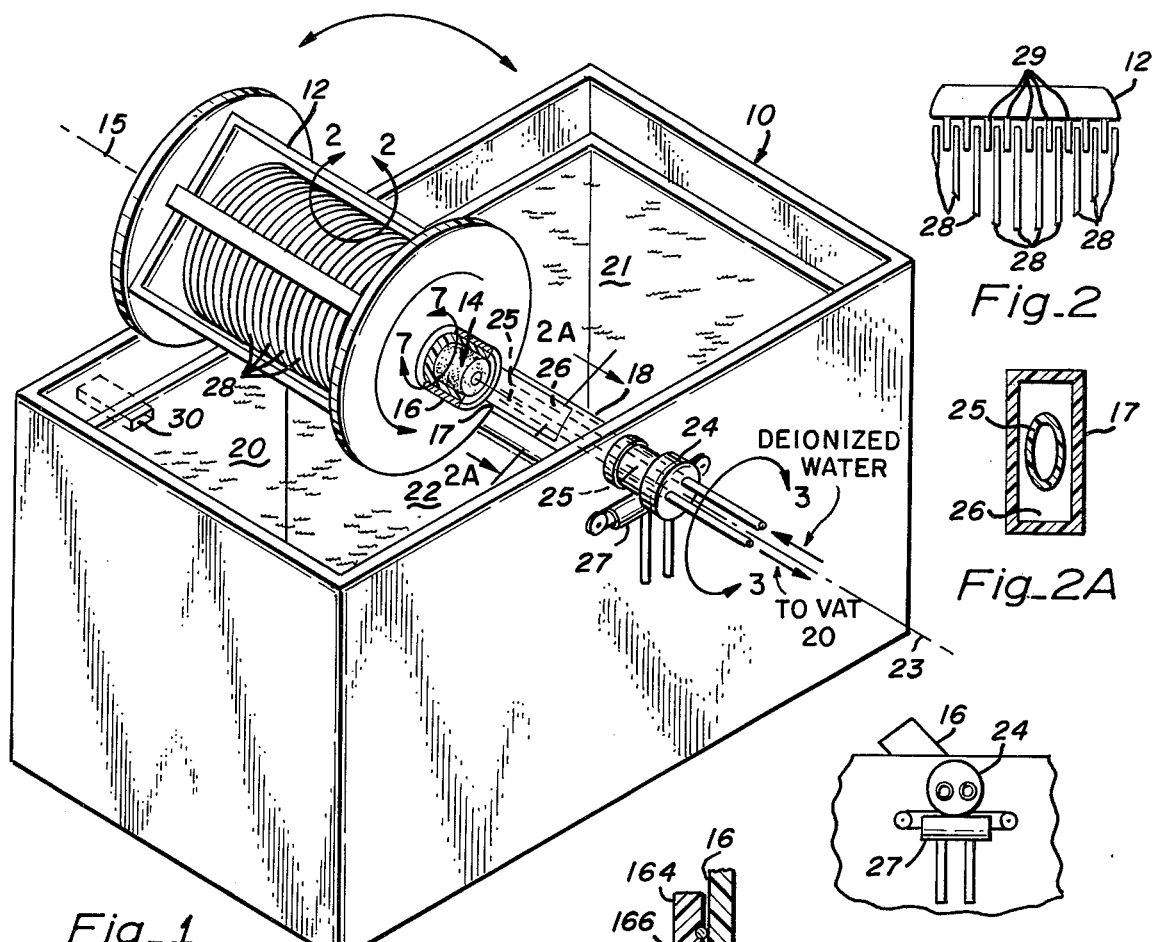
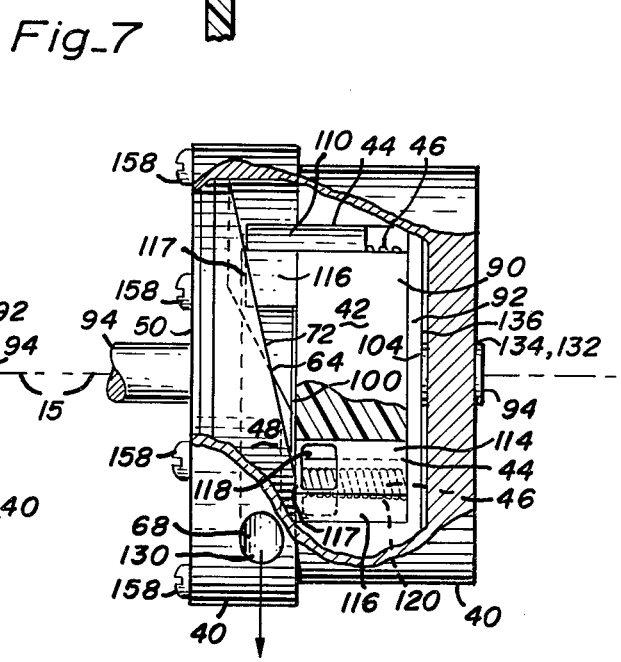

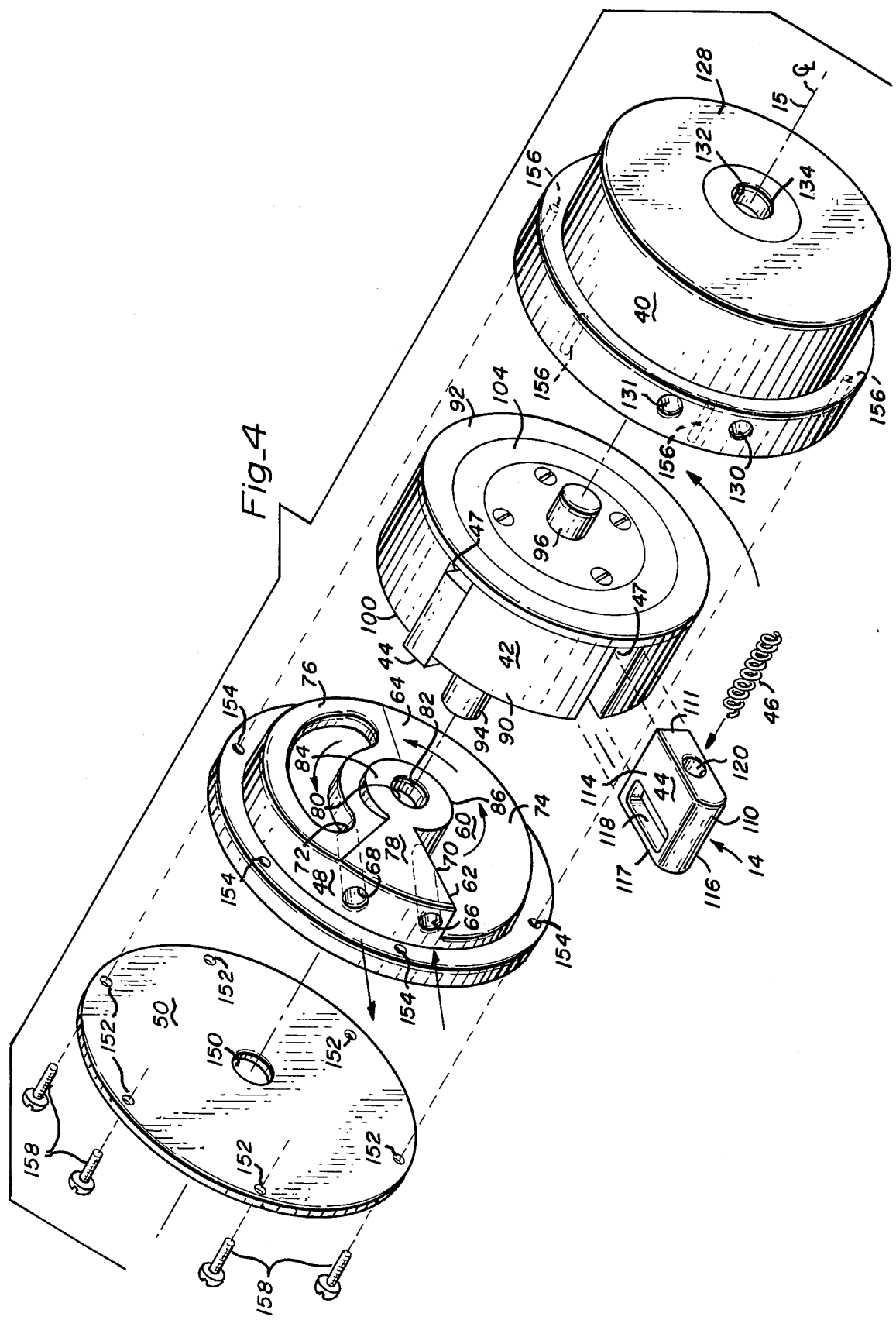

4,325,394

SUBMERSIBLE MOTOR CHEMICAL PROCESSING APPARATUS

BACKGROUND OF THE INVENTION

1. Field of the Invention

The present invention relates generally to a wet chemical processing apparatus and more particularly to an apparatus wherein the item to be processed is moved through a bath of liquid.

2. Description of the Prior Art

Processing items of manufacture by immersing them in a liquid bath is a well established manufacturing technique. In many instances, the nature of the item being processed and the nature of the process being performed on it interact cooperatively so that the desired result is easily achieved. An example of such a process is the chemical stripping of paint from a metallic object. Presuming that a chemical were used which would dissolve only the paint and not the metal, the stripping process terminates when all the paint has been removed from the metal. The uniformity of the process and the quality obtained in the treated item are essentially controlled by the cooperative interaction between the processing chemical and the characteristics of the item to be processed. The quality of the result produced by this process is almost independent of the nature of the apparatus in which the processing is performed. However, other chemical processes exist which are more demanding of the apparatus in which the processing takes place. An example of a process which places severe demands on the processing apparatus is the development of exposed photographic film. In that process both the chemical compositions of the baths and the duration and nature of the exposure of the film to the liquids in those baths greatly influences the quality of the result produced by the process.

As with the photographic industry, the semiconductor industry is vitally dependent upon liquid bath chemical processing. The processes used within that industry span the entire spectrum from processes which are highly tolerant to the nature of the apparatus, e.g. rinsing operations, to others which are highly sensitive to the nature of the apparatus, e.g. chemical etching. Perhaps one of the most dramatic examples of such a demanding process is the etching of silicon wafers.

Silicon wafers are a disk-shaped item approximately 0.025 inches thick and range between one and five inches in diameter. They are initially fabricated by slicing from a cylindrically-shaped single crystal boule of extremely pure silicon. Wafers are sliced from the boule by sawing, which chips the edges of the wafer and introduces both damage and stress to the wafer's circular planar surfaces. This damage and stress can be reduced or eliminated by chemically etching the wafers after slicing.

Silicon wafers are etched by submersion in a mixture of nitric acid and hydrofluoric acid buffered by the addition of acetic acid and heated to a temperature between 140° and 180° F. Introducing silicon wafers into this caustic material causes a violent chemical reaction which removes up to five thousandths of an inch of material per minute from the surface of the wafer. However, in addition to removing material, this reaction also produces gas bubbles on the wafer's surface. The presence of these bubbles interferes with the liquid etchant's contact with the surface of the wafer. If the wafer remains stationary while submerged in the etchant, these bubbles cause nonuniform etching and the process produces an unacceptable surface on the wafer. It is, however, possible to obtain an acceptable result with this process by supporting the wafer vertically on its edge while immersed in the liquid bath and rotating the wafer thus immersed. Under these processing conditions, the effects of the bubbles are spread more uniformly over the entire surface of the wafer. This seemingly simple process of rotating the wafer while it is submerged in the liquid bath raises technical problems because of the hostile environment in which the processing apparatus must reliably operate.

Current devices used for chemical etching of silicon wafers employ an open carrier into which a number of disk-shaped silicon wafers are loaded in a parallel orientation. This assembly with the carrier loaded with wafers is then lowered into the acid bath and rotated thereby rotating the wafers. The means used thus far to impart the rotary motion to the carrier employ an electric motor located outside the bath. The rotation of that motor is then either directly coupled to the carrier by means such as a polyvinyl chloride chain or by means of a set of parallel rotating rods passing horizontally through the walls of the vat containing bath. These prior devices, while successful at rotating the wafers, have experienced reliability and maintenance problems with mechanisms used to impart rotary motion arising from the hostile environment in which they must function.

SUMMARY OF THE PRESENT INVENTION

An object of the present invention is to provide a simple, reliable, improved apparatus for chemically processing an item in a liquid bath while rotating it.

Another object of the present invention is to provide a simple, reliable apparatus for rotating an item while the item undergoes chemical processing.

Another object of the present invention is to provide a continuous-rotation motor capable of reliable, long-lived operation in a chemically hostile environment.

Another object of the present invention is to provide a continuous-rotation hydraulic motor having high starting torque.

Another object of the present invention is to provide a continuous-rotation hydraulic motor capable of operation over a wide speed range.

Another object of the present invention is to provide a continuous-rotation hydraulic motor having high torque throughout the entire speed range of the motor.

Another objective of the present invention is to provide a continuous constant displacement rotation hydraulic motor whose speed is primarily determined by the pressure differential across the motor.

Briefly, the present invention in a preferred embodiment consists of a carrier for supporting silicon wafers. The carrier is mounted between the ends of two parallel arms so as to be rotatable by a continuous-rotation hydraulic motor. The hydraulic motor is attached to an end of one of the arms. Both arms are rigidly attached at their opposite ends to a shaft rotatably mounted about an axis substantially parallel to the axis of rotation of the carrier. The rotary shaft is located intermediate and above two rectangular vats arrayed so that a portion of the arms, the motor located at the end of one of the arms and the carrier attached to the motor can all be submerged in a liquid contained in either vat by rotating the shaft. A flow of liquid to power the continuous-rotation hydraulic motor is conducted to that motor by means of a rotary union mounted at one terminal end of the rotary shaft. After passing through the rotary union, this liquid flows to the motor through a tube passing inside of the rotary shaft and the arm to which the motor is attached. After flowing through the motor, this liquid flows from the motor through unoccupied space in the arm and the rotary shaft and thence back out of the apparatus through the rotary union.

The continuous-rotation hydraulic motor includes a vane cap, a plurality of vanes, a rotor and an outer housing. The vane cap has an annular-shaped cam surface having an abrupt-transition section and a ramp-shaped section. The ramp-shaped section is contacted by an end surface of the vanes which are retained within slots in the cylindrical rotor. As retained within the slots, the vanes are capable of motion longitudinally parallel to the axis of rotation of the rotor. The rotor is rotatably mounted so that one planar end surface of the rotor seals against the terminal region of the ramp-shaped section of the cam surface immediately adjacent to the abrupt-transition section. The vanes and rotor are enclosed within the outer housing to which the vane cap is rigidly attached and sealed. The abrupt-transition section of the cam surface contains a port through which liquid can flow into the motor. A flow of liquid entering the motor through this port presses against vanes extending out of the planar end surface of the rotor urging the vanes to move away from the abrupt-transition section and thereby causing the rotor to turn. The turning rotor carries the vanes along the ramp-shaped section. The ramp-shaped section is formed so as to cause the vanes which are extended from the rotor to retract within the slots of the rotor as they move along its surface. Thus, each vane becomes fully retracted within its slot in the rotor and flush with its planar end surface as it passes the region of the ramp-shaped section against which the rotor seals. As the retracted vane passes from the ramp-shaped section of the cam surface to the abrupt-transition section, the vane is caused to become fully extended from the rotor and to resume contact with the ramp-shaped surfaces. Once again extended and located immediately adjacent to the abrupt-transition section, the vane encounters the force of the flow of liquid passing through the port in the abrupt-transition section. Liquid whose flow has imparted motion to the vanes and rotor flows out of the motor through a second port located near the region of the ramp-shaped section of the cam surface to which the rotor seals.

An advantage of the present invention is that an item can be moved simply and reliably through an extremely caustic liquid during chemical processing.

Another advantage of the present invention is that the apparatus employs a continuous-rotation motor capable of reliable, long-life operation in a chemically hostile environment.

Another advantage of the present invention is that the continuous-rotation hydraulic motor has high starting torque.

Another advantage of the present invention is that the continuous-rotation hydraulic motor is capable of operating over a wide speed range.

Another advantage of the present invention is that the continuous-rotation hydraulic motor has high torque throughout its entire speed range.

Another advantage of the present invention is that the continuous-rotation hydraulic motor's speed is primarily determined by the pressure differential across the motor.

These and other objects and advantages of the present invention will no doubt become obvious to those of ordinary skill in the art after having read the following detailed description of the preferred embodiment as illustrated in the various drawing figures.

IN THE DRAWING

FIG. 1 is a perspective view of the apparatus for liquid bath chemical processing of silicon wafers with a terminal end of an arm partially cut away to show an outer housing of a continuous-rotation hydraulic motor;

FIG. 2 is a sectional view of a portion of the carrier with wafers inserted taken along the line 2—2 of FIG. 1;

FIG. 2A is a cross-sectional view of an arm of the apparatus for liquid bath chemical processing of silicon wafers taken along the line 2A—2A of FIG. 1;

FIG. 3 is a sectional view of the rotary union and the means by which the shaft is rotated for moving the motor and carrier from vat to vat taken along the line 3—3 of FIG. 1;

FIG. 4 is an exploded perspective view of the continuous-rotation hydraulic motor of the apparatus of FIG. 1;

FIG. 5 is a cut-away view of an assembled continuous-rotation hydraulic motor of FIG. 4 showing the fluid inlet port and a cross-sectional view of a vane.

FIG. 6 is a cut-away view of an assembled continuous-rotation hydraulic motor of FIG. 4 showing the outlet port and the helicoid-shaped transition region of the vane caps cam surface; and FIG. 7 is a cross-sectional view showing the motor shaft-arm seal taken along the line 7—7 of FIG. 1.

DETAILED DESCRIPTION OF THE PREFERRED EMBODIMENT

FIG. 1 shows a chemical processing apparatus referred to by the general reference number 10 and incorporating the present invention. The chemical processing apparatus 10 includes a carrier 12, referred to in the trade as a "wafer boat" for supporting arcuate silicon wafers. The carrier 12 is attached to a continuous-rotation hydraulic motor 14 adapted to rotate about an axis 15. The continuous-rotation hydraulic motor 14 is enclosed within a cylindrical housing 16 which is located at one terminal end of a first arm 17. A second arm, not shown, parallel to the first arm 17 is located about the opposite end of the wafer boat 12 and rotatably supports the wafer boat. Both the first arm 17 and the second arm are rigidly attached to a rotary shaft 18 located above and intermediate a first rectangular vat 20 and a second rectangular vat 21. The shaft 18 has an axis of rotation 23 about which it rotates. The vats 20 and 21 are separated by a common partition wall 22 and each is adapted to carry a supply of a solution. Vats 20 and 21 are each adapted to receive the assembled wafer boat 12, the continuous-rotation hydraulic motor 14, and portions of the first arm 17 and the second arm when the shaft 18 is rotationally positioned to its extreme positions. A rotary union 24 is attached to one terminal end of the rotary shaft 18. The continuous-rotation hydraulic motor 14 is energized by a flow of liquid conducted through the rotary union 24 to the motor 14 by means of a tube 25 (illustrated in broken lines), passing within the rotary shaft 18 and the first arm 17. After having passed through the hydraulic motor 14, this flow of liquid leaves the motor 14 through unoccupied space 26 (illustrated in broken lines) in arm 17 and the rotary shaft 18 and thence through the rotary union 24. Secured to the outside of the vats 20 and 21 immediately below the rotary shaft 18, is drive means for turning the rotary shaft 18. The illustrated drive means includes a hydraulic cylinder 27 having a piston with a length of cable attached to both ends thereof and wrapped around the circumference of the rotary shaft 18.

The chemical processing apparatus 10 is prepared for operation by filling the vats 20 and 21 with the liquids to be used. For example, for etching silicon wafers, the vat 20 may be filled with deionized water used to rinse the wafers and the vat 21 may be filled with an etchant mixture of nitric acid and hydrofluoric acid buffered by acetic acid which is heated to between 140° and 180° F. Initially, the rotary shaft 18 is positioned to support the wafer boat 12 in an elevated position outside of the baths of both vats 20 and 21. This permits silicon wafers 28 to be properly positioned in planar parallel side-by-side relationship in the wafer boat 12. Within the rotating wafer boat 12, the silicon wafers 28 are separated and retained in their planar parallel orientation by means of a plurality of separating fingers 29, shown in FIG. 2. At least one finger 29 separates each adjacent pair of silicon wafers 28.

After the boat 12 is loaded with wafers, the continuous-rotation hydraulic motor 14 is energized causing the wafer boat 12 filled with the silicon wafers 28 to rotate about the axis 15. The rotating wafer boat 12, the motor 14 and the terminal ends of the arms 17 are then submerged in the acid etchant of vat 21 by turning the rotary shaft 18 in a clockwise direction when viewed from the rotary union 24. After submersion in the etchant of vat 21 for approximately thirty seconds during which approximately 2.5 thousandths of an inch of material is removed from the surface of the silicon wafers, the rotating boat 12 and the motor 14 are transferred from the etchant to the deionized water in the first vat 20 by turning the rotary shaft 18 counter-clockwise about the axis 23. Rinsing silicon wafers 28 requires a large volume of deionized water to flow through the vat 20. Therefore, the chemical processing apparatus 10 of this invention has been particularly adapted to this process by causing the flow of deionized water to be directed first through the motor 14 to power its operation and then through the vat 20 from which it escapes by means of an overflow 30. Following the rinsing operation in the deionized water, the rotary shaft 18 is once again turned clockwise about the axis 23 to raise the wafer boat 12 above the liquid level of baths in order to allow removal of the boat 12 etched silicon wafers 28.

During submersion of the boat 12 in the acid etchant in vat 21, the separating fingers 29 impede contact of the etchant with the edge surfaces of the silicon wafer. This interference produces an effect known in the trade as "edge burn" wherein the etching is not uniform along the edges of the wafer. The means employed to retain the wafers in the wafer boat 12 is adapted to reduce or eliminate this edge burn by loosely securing the silicon wafers 28 within the wafer boat 12. By loosely securing the wafers 28 in this manner, the wafers are free to roll partially out of and back into the wafer boat 12 during each rotation of the boat about the axis 15. This rotary and translational motion of the silicon wafers 28 within the wafer boat 12 as the boat rotates, serves to spread the effect of the separating fingers 29 more or less uniformly around the edges of the wafers 28 in much the same way as rotating the wafers spread the effect of the bubbles over the entire surface of the wafers.

The reliability of an apparatus to etch silicon wafers may be increased if the number and complexity of the parts required to rotate the wafers are reduced as in this invention. However, the motor required for the simplified chemical processing apparatus 10 must be capable of reliable, long-lived operation when immersed in caustic chemicals. The use of a hydraulic motor 14 as opposed to an electrical motor greatly simplifies protecting it from attack by the caustic chemicals. This protection may be easily obtained by pressurizing the flowing liquid which powers the operation of the motor 14 so as to exclude the caustic processing chemicals from its interior and by fabricating the motor 14 from materials which resist chemical attack by the energizing liquid. While these features may also be obtained from pneumatic motors, a hydraulic motor 14 is preferred for a chemical processing apparatus 10 adapted to etching silicon wafers to one energized by compressed gases because hydraulic devices can be constructed for positive displacement operation unavailable from devices powered by compressed gases. A unique feature of the hydraulic motor 14 is that it is a positive displacement motor capable of continuous rotary motion as opposed to oscillating or reciprocating motion. This combination of features, continuous rotation and positive displacement, results in high torque both at stall and throughout the entire speed range of the motor 14.

An exploded view of the continuous-rotation hydraulic motor 14 is shown in perspective in FIG. 4. FIGS. 5 and 6 further illustrate the motor 14 with each being partial cut-away views of the assembled motor 14. The motor 14 comprises an outer housing 40 which receives a rotor 42. A plurality of four axial vanes 44 (two not visible) and a plurality of coil springs 46 equal in number to the plurality of vanes 44 are inserted into vane slots 47 of the rotor 42. A vane cap 48 and a retaining ring 50 are rigidly secured within the outer housing 40 in axially abutting relationship.

The unitary vane cap 48 has a nonplanar, annular-shaped cam surface 60 having an abrupt-transition section 63 about one terminal end and a ramp-shaped vane sealing section 64 about the other terminal end. The vane cap 48 also has a fluid inlet port 66 and a fluid outlet port 68. The fluid inlet port 66 has an outlet 70 located about the surface of the abrupt-transition section 62 of the cam surface 60. The fluid outlet port 68 has an inlet 72 located in the surface of the ramp-shaped vane sealing section 64. In the preferred embodiment the ramp-shaped vane sealing section 64 comprises three distinct regions, a first planar region 74, a helicoid-shaped transition region 76 and a second planar region 78. The terminal ends of these three regions of he ramp-shaped vane sealing section 64 and the terminal ends of the abrupt-transition section 62 are connected to form the cam surface 60 as follows. One terminal end of the abrupt-transition section 62 is connected to a terminal end of the first planar region 74. The other terminal end of the first planar region 74 is connected to one terminal end of the helicoid-shaped transition region 76. The other terminal end of the helicoid-shaped transition region 76 is connected to a terminal end of the second planar region 78. The other terminal end of the second planar region 78 is connected to the second terminal end of the abrupt-transition section 62. The inlet 72 to the fluid outlet port 68 is located in the helicoid-shaped transition region 76. Passing through the middle of the vane cap 48 is a cylindrical aperture 80 containing a radial bearing 82. Surrounding the cylindrical aperture 80 and concentric with it is a thrust bearing 84. A cylindrically-shaped inner circumferential vane sealing surface 86 whose axis is concentric with that of the cylindrical aperture 80 surrounds the thrust bearing 84 and connects its surface to the cam surface 60. The entire surface of the ramp-shaped vane sealing section 64 is formed so as to be tangent to rays originating on and perpendicular to the axis of the cylindrical aperture 80.

The rotor 42 comprises a cylindrically-shaped rotor body 90, a disk-shaped end plate 92 and a rod-shaped motor shaft 94. The motor shaft 94 passes through a rotor shaft aperture 96 formed through and about the axes 15 of the cylindrically-shaped body 90 and the end plate 92. Both the motor shaft 94 and the end plate 92 are rigidly attached to the rotor body 90 such that they rotate in unison. The vane slots 47 are spaced equally around the circumference of the cylindrically-shaped body 90. The vane slots 47 are each shaped so as to mate with, receive, retain, guide and position the vanes 44. A cam sealing end surface 100 is formed on the end of the cylindrically-shaped body 90 opposite that to which the end plate 92 is attached. The cam sealing end surface 100 is shaped to conform with the cam surface 60 of the vane cap 48 immediately adjacent to one terminal end of its abrupt-transition axial section 62. Also located in the cam sealing end surface 100 of the cylindrically-shaped body 90 is a thrust bearing 102 designed to mate with the thrust bearing 84 in the vane cap 48. A thrust bearing 104 is also located on the side surface of the end plate 92 furtherest away from the cylindrically-shaped body 90.

The vanes 44 are shaped to have planar sides except for an outer side surface 110 which is arcuate in the shape of a circular arc having a radius substantially equal to that of the cylindrically-shaped body 90 so as to fit the circle traced by the outer side surface 110 as the vane 44 moves under the influence of the turning rotor 42. Immediately opposite the curved outer side surface 110 is a planar inner side surface 111. A planar in-flow side surface 114 and a parallel planar out-flow side surface 116 are located on opposite sides of the vane 44 between the outer side surface 110 and the inner side surface 111. One of the ends of the vane 44 is a cam sealing surface 117 shaped so as to conform with the cam surface 60 of the vane cap 48. The in-flow side surface 114 and the out-flow side surface 116 share respective edges with the cam sealing surface 117. The vane 44 also has an aperture 118 called a pocket formed in the in-flow side surface 114 of the vane 44 and extending into the volume thereof with a segment of periphery of the pocket 118 located in close proximity to the common edge which the in-flow side surface 114 shares with the cam sealing surface 117. A spring retaining aperture 120 is formed in the surface of the vane 44 opposite to that of the cam sealing surface 117 and extends into the volume of the vane 44 reaching to the pocket 118.

The outer housing 40 has a disk-shaped end surface 128 configured to fit around and enclose the rotor 42 and the vanes 44 and also so as to attach to and seal with the vane cap 48. The outer housing 40 also has a pair of fluid apertures 130 and 131 adapted to mate respectively with the fluid inlet port 66 and the fluid outlet port 68 of the vane cap 48 when the outer housing 40 is attached to and sealed with the vane cap 48. Located in the middle of the disk-shaped end surface 128 of the outer housing 40 is an aperture 132 containing a radial bearing 134 adapted to mate with the motor shaft 94. A thrust bearing 136 is located on the inner surface of the disk-shaped end surface 128 surrounding the aperture 132 and is adapted to mate with the thrust bearing 104 on the end plate 92 of the rotor 42. The outer housing 40 has an inner cylindrical surface 138 shaped so as to mate with the outer surface 110 of the vanes 44 as they move under the influence of the turning rotor 42. (See FIG. 5)

Referring more specifically to FIGS. 5 and 6, when the continuous-rotation hydraulic motor 14 is assembled the vane cap 48 is secured within the outer housing 40 by the disk-shaped retaining ring 50. The retaining ring 50 is adapted to this function by means of a central aperture 150 (See FIG. 4) shaped to fit loosely about the motor shaft 94 and a plurality of peripheral apertures 152. The vane cap 48 has a similar plurality of apertures 154 equal in number to and aligned with the peripheral apertures 152 of the retaining ring 50. A plurality of threaded apertures 156, equal in number to and aligned with the apertures 152 and 154, are similarly formed in the outer housing 40. A plurality of screws 158, equal in number to the number of peripheral apertures 152 in the retaining ring 50, secure the retaining ring 50 and the vane cap 48 within the housing 40 by passing through the apertures 152 and 154 and threading into the apertures 156.

The motor 14 is assembled as follows. The rotor 42 with the end plate 92 and motor shaft 94 attached to the body 90 is inserted into the outer housing 40 so that the motor shaft 94 passes through the aperture 132 and mates with the bearing 134 and the thrust bearing 136 mates with the thrust bearing 104. One of the coil springs 46 is inserted into each of the spring retaining apertures 120 of the vanes 44 and the assembled vanes 44 and springs 46 are then inserted into each of the vane slots 47 in the body 90. The vanes 44 are oriented within the vane slots 47 so that the outer side surface 110 of the vane 44 establish sealing relationships with the inner cylindrical surface 138 of the outer housing 40 and the coil spring 46 contacts the disk-shaped end plate 92 of the rotor 42. The cylindrical aperture 80 of the vane cap 48 is first passed over the length of the motor shaft 94 projecting out of the cam sealing end surface 100 and then the vane cap 48 is inserted into the outer housing 40. With the vane cap 48 thus inserted in the outer housing 40, the radial bearing 82 in the vane cap 48 mates with the motor shaft 94 and the thrust bearing 84 of the vane cap 48 mates with the thrust bearing 102 located in the cam sealing end surface 100 of the cylindrically-shaped rotor body 90. Fully inserting the vane cap 48 into the housing 40 establishes sealing relationships between the cam sealing end surface 100 of the cylindrically-shaped rotor body 90 and the immediately adjacent terminal end of the abrupt-transition section 62 and also between inner side surfaces 111 of the vanes 44 and the inner circumferential vane sealing surface 86 of the vane cap 48. Proper orientation of the vane cap 48 in the housing 40 aligns the fluid inlet port 66 and the fluid outlet port 68 of the vane cap 48 with the fluid apertures 130 and 131 in the outer housing 40. Assembly of the motor 14 is completed by passing the central aperture 150 of the retaining ring 50 over the length of motor shaft 94 projecting beyond the vane cap 48, inserting the retaining ring 50 into the outer housing 40 and securing it with the screws 158.

Energizing the assembled motor 14 by a flow of liquid causes it to operate as follows. The flow of liquid enters the fluid inlet port 66 by passing through the fluid aperture 130 in the outer housing 40 and exits the fluid inlet port 66 at its outlet 70 in the abrupt-transition section 62. Passing through the outlet 70, the fluid enters a variable volume inlet chamber enclosed by the fixed surface area of the abrupt-transition section 62 and varying area surface regions of the ramp-shaped vane sealing section 64, the cam sealing end surface 100 of the rotor body 90, the in-flow side surface 114 of the vane 44 and the pocket 118, the inner circumferential vane sealing surface 86 of the vane cap 48 and the inner cylindrical surface 138 of the outer housing 40. The volume contained within the region bounded by these surfaces varies because the flowing liquid exerts a pressure on the vane 44 causing it to apply a force to the vane slot 47 retaining the vane 44 in the rotor body 90 thereby urging the rotor 42 to turn. In response to this force the rotor 42 turns causing the vane 44 to move in a circular path away from the abrupt-transition section 62 and along the ramp-shaped vane sealing section 64. The surfaces which enclose this variable volume inlet chamber are shaped such that the sealing relationships between the various parts of the motor 14 are maintained as the rotor 42 turns.

As the cam sealing surface 117 of the vane 44 moves along the ramp-shaped vane sealing section 64 of the cam surface 60 under the influence of the turning rotor 42 it contacts the helicoid-shaped transition region 76 and is urged by that surface to slide longitudinally within the vane slot 47 parallel to the axis about which the rotor turns. As the rotor 42 continues to turn, the vane 44 slides ever deeper into the vane slot 47 thereby compressing the coil spring 46 between the disk-shaped end plate 92 and the surface of the pocket 118 closest to the cam sealing surface 117 of the vane 44. Continued turning of the rotor 42 causes the vane 44 to retract within the vane slot 47 until cam sealing surface 117 becomes essentially flush with the cam sealing end surface 100 of the rotor body 90 as the cam sealing surface 117 reaches the terminal end of the helicoid-shaped transition region 76 and moves onto the second planar region 78. As the the rotor 42 continues to turn the cam sealing surface 117 of the vane 44 reaches and passes beyond the immediately adjacent terminal end of the abrupt-transition section 62 with which the cam sealing surface 100 of the rotor body 90 has a sealing relationship. As the cam sealing surface 117 passes this terminal end, the compressed coil spring 46 urges the vane 44 to slide longitudinally out of the vane slot 47 so that the vane 44 once again extends beyond the cam sealing end surface 100 of the rotor body 90.

As the vane 44 begins to extend out of the vane slot 47, the pocket 118 encounters the flow of liquid through the outlet 70 of the fluid inlet port 66. The force of this flow urges the vane 44 to fully extend from the cylindrically-shaped rotor body 90 thereby forming the sealing relationship between the first planar region 74 of the ramp-shaped vane sealing section 64 and the cam sealing surface 117 of the vane 44. The force of the flowing liquid acting upon the vane 44 thus extended out of the cylindrical body 90 also causes the vane 44 to cock slightly in the vane slot 47 thereby increasing the frictional force between the surface of the vane slot 47 and the surface of the vane 44. This increased frictional force acts so as to maintain the vane 44 in its extended position out of the rotor 42. The length of the coil spring 46 is selected such that it urges the vane 44 to extend out of the vane slot 47 only through the least extended portion of the travel of the vane 44. The force acting on the vane 44 which causes it to cock within the vane slot 47 and the frictional engagement between the vane 44 and the vane slot 47 are reduced as the turning rotor 42 moves the vane 44 past the inlet 72 to the fluid outlet port 68. Lowering the frictional force between the vane 44 and the vane slot 47 in this manner reduces the amount of force which the helicoid-shaped transition region 76 must apply to the cam sealing surface 117 of the vane 44 in order to cause the vane 44 to retract into the vane slot 47.

The preferred shaped for the abrupt-transition section 62 is one which limits the cam sealing surface 117 to entering a sealing relationship with the abrupt-transition section 62 only along its common terminal end with the second planar region 78. For vanes 44 having planar inflow side surfaces 114, the abrupt-transition section 62 is thus shaped so that its common terminal end with the second planar region 78 is a straight line substantially parallel to the in-flow side surface 114 as that surface passes the common terminal end. This shape for the abrupt-transition section 62 and its common terminal end with the second planar section 78 is preferred because it assists in providing the combination of forces which cause the vane 44 to extend fully from the rotor 42 and enter into the sealing relationship with the vane sealing section 64. By thus shaping the abrupt-transition section 62 so as to contact the cam sealing surface 117 of the vane 44 only along its common terminal end with second planar section 78, the hydraulic motor 14 is capable of continuous rotation in only one direction. Reversing the direction of flow of the liquid causes the motor to reverse its direction of rotation only until one of the vanes 44 contacts the abrupt-transition section 62. The contact of the vane 44 with the abrupt-transition section 62 prevents further motion of the rotor 42 and interrupts the flow of liquid by sealing the outlet 70 of the fluid inlet port 66.

Corresponding to the variable volume inlet chamber is a variable volume outlet chamber formed by principally the same surfaces as the variable volume inlet chamber. However, the surface of the variable volume outlet chamber does not include the abrupt-transition section 62 of the cam surface 60 and the in-flow side surface 114 of the vane 44 is replaced by the out-flow side surface 116. Energizing the motor 14 by a flow of liquid causes the liquid contained within the variable volume outlet chamber to be pressurized by force applied to it by out-flow side surface 116 of the vane 44. This force is supplied to the vane 44 by the liquid which flows through the outlet 70 of the fluid inlet port and presses against the in-flow side surface 114 of the vane 44. The pressure thus applied to the liquid within the variable volume outlet chamber causes that liquid to flow through the inlet 72 of the fluid outlet port 68 located in the helicoid-shaped transition region 76 of the ramp-shaped vane sealing section 64. This flow of liquid exits the motor by passing through the fluid outlet port 68 in the vane cap 48 and then through the fluid aperture 130 in the outer housing 40 with which the fluid outlet port 68 mates.

As described, the preferred embodiment of this continuous rotation hydraulic motor 14 includes axial thrust bearings located on both end surfaces of the rotor 42. These axial thrust bearings serve to reduce the frictional forces between the turning rotor 42 and the stationary vane cap 48 and outer housing 40. These frictional forces which oppose the rotation of the rotor with respect to these stationary components are greatest when the motor is first energized by starting the flow of liquid. As the flow of liquid starts, it applies pressure to all the surfaces bounding the variable volume inlet chamber. One of these surfaces is the cam sealing end surface 100 of the rotor body 90. The force applied to the cam sealing end surface 100 urges the end plate 92 of the rotor 42 into frictional contact with the disk-shaped end surface 128 of the outer housing 40. Without the thrust bearings 104 and 136 these frictional forces can be great enough to stall the motor 14 and prevent it from operating. Since the sealing relationships between the various components of the motor 14 do not exclude liquid from entering the space between the end plate 92 and the disk-shaped end surface 128, the pressure of the liquid which caused the initial frictional contact ultimately causes liquid to enter the space between these surfaces. The liquid which enters this space applies a force to the end plate 92 of the rotor 42 ultimately urging the end plate 92 out of frictional contact with the disk-shaped end surface 128 and then urging the cam sealing end surface 100 of rotor body 90 into frictional contact with the vane cap 48. Without the thrust bearings 84 and 102, this second frictional contact can also be great enough to prevent the operation of the motor 14. After the initial surge of liquid into the motor 14 has passed, the axial forces applied by the liquid to the end surfaces of the rotor 42 are largely balanced and only light loads are applied to the axial thrust bearings located on opposite end surfaces of the rotor 42. Thus, the inaction of axial thrust bearings 84 and 102 and 104 and 136 serve to reduce the frictional forces between the rotor 42 and the stationary vane cap 48 and outer housing 40 principally during initial start-up of the motor.

Since this motor 14 is a constant displacement motor, its rotational speed is determined primarily by the rate at which the liquid flows through the motor. That rate is primarily controlled by the pressure differential across the motor 14. Thus, the speed at which the motor 14 turns is established primarily by the pressure differential in the liquid flowing through the motor 14.

A motor 14 constructed in accordance with the teachings of this invention and having a rotor diameter of approximately 2½ inches and four vanes 44 extending approximately 4/10ths of an inch from the cam sealing end surface 100 of the cylindrically-shaped rotor body 90 achieves the following performance. This motor 14 produces approximately fifty ounce inches of torque at stall when a fifty pound per square inch pressure differential is applied to it. The motor operates over a speed range of from 0 to 600 rpm and produces an almost constant torque of approximately 75 ounce inches throughout that entire speed range when operated with a fifty pound per square inch pressure differential in the liquid flowing through the motor.

In the preferred embodiment of the chemical processing apparatus 10 the continuous-rotation hydraulic motor 14 is completely surrounded by and enclosed within the structure of the arm 17 except for the length of the motor shaft 94 projecting beyond the material of the arm 17 toward the wafer boat 12. In operation the pressure of the liquid passing through the motor 14 is adjusted so as to exceed the pressure of the liquid of the bath in which the motor 14 is submerged. This difference in pressure between the liquid within the continuous-rotation hydraulic motor 14 and the liquid of the bath insures that none of the liquid in the bath reaches the components of the motor 14 other than for the length of the motor shaft 94 extending beyond the material of the arm 17. Thus, only the material from which the motor shaft 94 and the arm 17 are fabricated, must be chemically compatible with the chemicals into which these components are submerged. The remainder of the components in the motor 14 need only be fabricated from materials chemically compatible with the liquid whose flow powers the motor.

Because the process of etching silicon wafers for which the chemical processing apparatus 10 was especially developed requires a large flow of deionized water to pass through the rinse bath in the vat 20, this flow is conveniently available to power the motor 14. Thus, even though the continuous-rotation hydraulic motor 14 is submerged in a mixture of nitric acid and hydrofluoric acid buffered by acetic acid, the materials from which it is constructed, other than for the motor shaft 94, need only resist chemical attack by deionized water. Since the pressure of the deionized water flowing through the motor 14 is greater than that of the liquid in the bath, the motor shaft 94 must be sealed to prevent contaminating the etchant in vat 21 with water escaping from the motor 14.

FIG. 7 illustrates means of preventing the escape of water from around the motor shaft 94 comprising a teflon O-ring 160 retained within a circular groove 162 formed in the side surface of a teflon member 164. The teflon member 164 has a cylindrical aperture 166 passing through it shaped so as to seal with the motor shaft 94 and formed concentric with the circular groove 162. The member 164 is secured to the motor shaft 94 so as to retain the O-ring 160 in sealing contact against the side of the arm 17.

Because of the particular application to which the motor 14 has been adapted, the motor shaft 94 projects only slightly beyond the disk-shaped end surface 128 of the outer housing 40 while it extends a significant distance beyond the outer surface of the retaining ring 50. In other applications of the motor 14 it may be preferable to extend the shaft 94 further beyond the disk-shaped end surface 128 of the outer housing 40 in order to permit coupling to the shaft 94 from that side of the motor 14.

There are various structural variations possible for the motor 14. For example, motors having a greater or a smaller number of vanes 44 can be constructed although self-starting of the motor and its performance will probably be degraded if fewer than four vanes 44 are used. Another variation would be to add a ring extending out of the vane cap 48 to seal against the outer surface 110 of the vanes 44 rather than employing the inner cylindrical surface 138 of the outer housing 40 to provide that sealing surface. Conversely, another variation of the motor 14 could be constructed by eliminating the outer housing 40 and by encircling the cylindrically-shaped body 90 of the rotor 42 with a ring-shaped sealing member which would form seals with both the outer circumference of the disk-shaped end plate 92 and the outer surface 110 of the vanes 44. Such a ring would also have to be rotatably sealed to the vane cap 48. The entrance to the fluid inlet port 66 and the fluid outlet port 68 in the vane cap 48 of such a motor would have to be altered from that of the preferred embodiment so that their respective entrance and exit were past the end of the ring-shaped sealing member furtherest from the disk-shaped end plate 92 or were through the side of the vane cap 48 contacted by the retaining ring 50. The power developed by such a variant motor could be transferred from the motor either by coupling to the motor shaft 94 or by coupling to the outside surface of the ring surrounding the cylindrically-shaped body 90. In a motor constructed in this fashion, the radial bearing and axial thrust bearings required for successful operation of the motor could have to be located solely on the vane cap 48.

Another variation includes having the vanes 44 rotatably attached to the rotor body 90 along the edge of the vane 44 furthest from the cam sealing surface 117. There would be no vane slots 47 in such a rotor 42 but rather the cam sealing end surface 100 would contain apertures adapted to receive and fit the hinged vanes so that the cam sealing end surface 100 and the outflow side surface 116 would be essentially planar as the vane passed over the second planar region 78 of the cam surface 60.

An entire family of motors can be derived from the motor 14 by varying the angle between the longitudinal motion of the vane 44 and the axis about which the rotor 42 revolves. Thus, motors can be constructed with the longitudinal travel of the vanes 44 parallel to, perpendicular to or at any intermediate angle to the axis about which the rotor 42 turns provided that the rotor 42 and the vane slots 47, the vanes 44, the vane cap 48 and their sealing surfaces are shaped properly. Certain features in the construction of a continuous rotation hydraulic motor 14 are affected by this angle. For example, since the mass of the vanes 44 turning with the rotor 42 urges them to move away from the axis about which the rotor 42 turns, the force thus produced can assist in establishing the sealing relationship between the cam sealing surface 117 of the vane 44 and the cam surface 60 of the vane cap 48 if the longitudinal motion of the vanes is not parallel to the axis of rotation. Since the magnitude of this force increases as the angle of longitudinal travel increases from parallel to perpendicular, it may become large enough to permit elimination of the coil springs 46. Alternatively, the volume occupied by a motor 14 having the longitudinal motion of the vanes 44 perpendicular to the axis about which the rotor 42 turns is larger than a comparable one having the same size vanes 44 and same amount of extensive travel of the vane 44 oriented parallel to the axis about which the rotor 42 turns. Thus, the selection of the angle between the longitudinal motion of the vanes 44 and the axis about which the rotor 42 turns is complicated and can be influenced by a number of factors including the space into which the motor 14 must fit. In the chemical processing apparatus 10, longitudinal motion of the vanes 44 parallel to the axis about which the rotor 42 turns was selected to obtain a compact motor suitable for containment within the end of the arm 17.

While the operation of the motor 14 has been explained employing a flow of liquid as the energy source, it is obvious that pressurized gases could also be used for this same purpose. Since gases are less vicious than liquids, the sealing relationships established between the various surfaces of the parts of the motor 14 would probably have to be enhanced in a motor adapted to operate on a flow of pressurized gases over those of one adapted to operate on a flow of liquid.

While the structure of this invention has been described in terms of a continuous-rotation hydraulic motor 14 which converts the energy in a flow of liquid into rotational energy of the motor shaft 94, this process is reversible. Thus, the motor 14 will function as a pump to create a flow of liquid if rotational energy is applied to the motor shaft 94. Note that in the preferred embodiment of such a pump the aperture of the pocket 118 would not pass through the in-flow side surface 114 of the vane 44 but would rather pass through the out-flow side surface 116 of the vane 44. This adaptation of the vane structure of this invention is necessary to provide the force which causes the cam sealing surface 100 of the vane 44 to enter into a sealing relationship with the ramp-shaped sealing section 64 of the cam surface 60.

Although the present invention has been described in terms of the presently preferred embodiment, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. Apparatus for chemically processing an item in a fluid bath comprising:

retaining means for retaining an item to be chemically processed, the retaining means having openings through which a processing liquid can pass and contact the surfaces of said item to be processed when the retaining means is positioned within a supply of processing liquid;

a continuous-rotation motor coupled to the retaining means for rotationally driving the retaining means about a first axis;

drive means engaged to the motor for supporting and moving the motor and retaining means in unison between a first position and a second position; and vat means forming at least one vat for supporting a supply of processing liquid, the vat means being positioned relative to the drive means to receive the motor with the retaining means attached thereto within the confines of the vat means when the motor and retaining means are adjacent said first position.

2. The apparatus of claim 1 wherein the retaining means includes a wafer boat with a plurality of receiving positions for receiving a plurality of disks in side-by-side orientation and alignment with a spacing intermediate adjacent positions, a constraining member extending end-to-end of said receiving stations for constraining said disks within the receiving positions as the retaining means is rotationally driven about said axis and moved between said first and second positions.

3. The apparatus of claim 2 wherein said constraining member is positioned relative to said receiving positions at a distance exceeding the diameter of said disks to permit the disk to rotate and move radially within their respecting positions as the retaining means is rotated about said axis.

4. The apparatus of claim 1 wherein the drive means includes a rotatable shaft mounted to the vat means with the axis of said shaft being substantially parallel with said first axis and a pair of equal length parallel arms projecting from said shaft with one terminal end of each arm rigidly attached to the shaft and the other terminal end of each arm attached to the retaining means; and wherein the rotation motor is a hydraulic motor and engaged to and supported by one of said arms; and including supply means engaged to at least one of said arms for conducting a supply of fluid to said motor.

5. The apparatus of claim 4 wherein the supply means for conducting a supply of liquid to said motor includes a tube passing through the interior of said rotatable shaft and the interior of said arm engaged to said motor.

6. The apparatus of claim 1 wherein the continuous-rotation motor comprises:
   a unitary vane cap having a cam surface with an abrupt-transition section and a ramp-shaped vane sealing section, said abrupt-transition section and said vane sealing section sharing common terminal ends, a fluid inlet port having an outlet located in said abrupt-transition section and a fluid outlet port having an inlet located in said vane sealing section;
   a vane having a cam sealing surface at one of its terminal ends with said cam sealing surface shaped to conform with said cam surface of the vane cap, an in-flow side surface and an out-flow side surface on opposite sides of the vane with said side surfaces sharing respective edges with said cam sealing surface;
   a rotor having a cam sealing end surface formed on one of the terminal ends of its body and shaped to conform with said cam surface of the vane cap at the immediately adjacent terminal end of said abrupt-transition section, the rotor being rotatably secured to the vane cap with said cam sealing end surface retained immediately adjacent to said terminal end of said abrupt-transition section to which it conforms and establishing a sealing relationship with said cam surface and being adapted to permit coupling of the rotor to a load, an aperture formed in said cam sealing end surface and said body of the rotor, said aperture being shaped so as to secure the mate with the vane such that said cam sealing surface of the vane is maintained in a sealing relationship with said cam surface as the rotor rotates, said cam sealing surface of the vane being urged into said sealing relationship with said cam surface of the vane cap when the vane is installed in said aperture of the rotor and the motor is operated; and
   means for sealing the rotor and the vane cap to constrain a flow of fluid entering the motor through said fluid inlet port to leave the motor through said fluid outlet port.

7. A continuous-rotation motor comprising:
   a unitary vane cap having a cam surface with an abrupt-transition section and a ramp-shaped vane sealing section, said abrupt-transition section and said vane sealing section sharing common terminal ends, a fluid inlet port having an outlet located in said abrupt-transition section and a fluid outlet port having an inlet located in said vane sealing section;
   a vane having a cam sealing surface at one of its terminal ends with said cam sealing surface shaped to conform with said cam surface of the vane cap, an in-flow side surface and an out-flow side surface on opposite sides of the vane with said side surfaces sharing respective edges with said cam sealing surface;
   a rotor having a cam sealing end surface formed on one of the terminal ends of its body and shaped to conform with said cam surface of the vane cap at the immediately adjacent terminal end of said abrupt-transition section, the rotor being rotatably secured to the vane cap with said cam sealing end surface retained immediately adjacent to said terminal end of said abrupt-transition section to which it conforms and establishing a sealing relationship with said cam surface and being adapted to permit coupling of the rotor to a load, an aperture formed in said cam sealing end surface and said body of the rotor, said aperture being shaped so as to secure the mate with the vane such that said cam sealing surface of the vane is maintained in a sealing relationship with said cam surface as the rotor rotates, said cam sealing surface of the vane being urged into said sealing relationship with said cam surface of the vane cap when the vane is installed in said aperture of the rotor and the motor is operated; and
   means for sealing the rotor and the vane cap to constrain a flow of fluid entering the motor through said fluid inlet port to leave the motor through said fluid outlet port.

8. The continuous-rotation motor of claims 6 or 7 wherein
   said cam surface of the vane cap is non-planar and said annular-shaped and said ramp-shaped vane sealing section of said cam surface comprises a first planar region sharing a common terminal end with said abrupt-transition section, a helicoid-shaped transition region sharing a common terminal end with said first planar region, and a second planar region sharing one of its terminal ends with said helicoid-shaped region and the other of its terminal ends with said abrupt-transition section, said inlet to said fluid outlet port being located in said helicoid-shaped transition region.

9. The continuous-rotation motor of claim 8 wherein the entire surface of said vane sealing section of said cam surface of the vane cap is formed so as to be tangent to rays originating on and perpendicular to the axis of rotation of the rotor.

10. The continuous-rotation motor of claims 6 or 7 wherein
    said abrupt-transition section of said cam surface of the vane cap is shaped such that said cam sealing surface of the vanes can enter into a sealing relationship with said abrupt-transition section only along said terminal end of said abrupt-transition section immediately adjacent to said cam sealing surface of the rotor.

11. The continuous-rotation motor of claims 6 or 7 wherein
    said vane cap further includes an inner circumferential vane sealing surface, said surface shaped so as to maintain a sealing relationship with the inner side surface of the vane as it moves under the influence of the turning rotor and said cam surface of the vane caps.

12. The continuous-rotation motor of claims 6 or 7 wherein
    said in-flow side surface and said out-flow side surface of the vane are both planar and said planar surfaces are parallel.

13. The continuous-rotation motor of claims 6 or 7 wherein
    the vane and said aperture in the rotor are shaped so as to permit the vane to slide longitudinally parallel to the axis of rotation of the rotor within said aperture as said vane moves under the influence of the turning rotor and said cam surface of the vane cap.

14. The continuous-rotation motor of claims 6 or 7 wherein the vane is cylindrically-shaped with said cylindrical axis parallel to said in-flow side surface, said outer side surface of the vane being in the shape of a circular arc having a radius approximately equal to the radius of the circle traced by said outer side surface as the vane moves under the influence of the turning rotor.

15. The continuous-rotation motor of claims 6 or 7 wherein
the vane further includes an aperture formed in said in-flow side surface and extending into the volume thereof, a segment of the periphery of said aperture being located in close proximity to the common edge which said in-flow side surface shares with said cam sealing surface.

16. The continuous-rotation motor of claims 6 or 7 wherein
the rotor is in the shape of a right circular cylinder into which an aperture has been formed to mate with and receive the vane.

17. The continuous-rotation motor of claims 6 or 7 wherein
the aperture in said body of the rotor which is shaped so as to mate with and receive the vane is formed such that when said vane is positioned at its furthest extension out of the rotor in said sealing relationship with said cam surface of the vane cap, said vane, in response to the force applied to it by a flow through the motor, can cock in said aperture whereby the frictional forces between the surface of said aperture and the surface of said vane is increased.

18. The continuous-rotation motor of claims 6 or 7 further comprising:
a spring disposed between the rotor and the vane, the spring applying a force to both the rotor and the vane whereby the said cam sealing surface of the vane is urged into said sealing relationship with said cam surface of the vane cap.

19. The continuous-rotation motor of claim 18 wherein
said force applied by the spring to the vane urging the vane into sealing relationship with said cam surface acts only through that portion of the vanes extensive travel out of said aperture in which the vane is not fully extended from said aperture in the rotor.

20. The continuous-rotation motor of claim 19 wherein
the spring is a coil spring; and
the vane further includes an aperture formed in the side of the vane immediately opposite said cam sealing surface and extending into the volume thereof, said aperture formed to receive and guide the coil spring.

21. The continuous-rotation motor of claims 6 or 7 further comprising:
an aperture formed through said vane cap, said aperture surrounding the projection of the axis of rotation of the rotor through the vane cap;
a radial bearing means contained within said aperture in the vane cap;
a shaft passing entirely through said aperture of the vane cap and retained within the radial bearing means contained therein; and
means for attaching and retaining the rotor on the shaft whereby the rotor is rotatably secured with respect to the vane cap so that said cam sealing end surface of the cap is retained immediately adjacent to said terminal end of said abrupt-transition section to which said cam sealing end surface of the rotor conforms.

22. The continuous-rotation motor of claims 6 or 7 further comprising:
an axial thrust bearing means disposed between the vane cap and the rotor.

23. The continuous-rotation motor of claims 6 or 7 wherein
the means for sealing the rotor and the vane cap to constrain fluid flow entering the motor through said fluid inlet port to leave the motor through said fluid outlet port includes an outer housing shaped so as to enclose the rotor and to attach to and seal with the vane cap.

24. The continuous-rotation motor of claim 23 wherein
the outer housing further comprises an aperture shaped to mate with said inlet port of the vane cap when the outer housing is attached to and sealed with the vane cap whereby fluid flowing into the motor through said inlet port reaches said port by first flowing through said aperture in the outer housing.

25. The continuous-rotation motor of claim 23 wherein
the outer housing further comprises an aperture shaped to mate with said outlet port when the outer housing is attached to and sealed with the vane cap whereby fluid flowing out of the motor through said outlet port flows out of the motor through said aperture in the outer housing.

26. The continuous-rotation motor of claim 23 wherein
the inner cylindrical surface of the outer housing is shaped so as to mate with said outer surface of the vanes as the vane moves under the influence of the turning rotor whereby a sealing relationship is established between the vane and said inner cylindrical surface of the outer housing when the outer housing is attached to the vane cap.

27. The continuous-rotation motor of claim 23 further comprising:
an aperture formed through said outer housing, which aperture surrounds the projection of the rotor's axis of rotation through the outer housing;
a radial bearing means contained within said aperture in the outer housing;
a shaft passing through said aperture of the outer housing and retained within the radial bearing means contained therein; and
means for attaching and retaining the rotor on the shaft whereby the rotor is rotatably secured with respect to the outer housing.

28. The continuous-rotation motor of claim 23 further comprising:
an axial thrust bearing means disposed between the outer housing and the rotor.

* * * * *